(12) United States Patent
Hubner

(10) Patent No.: US 7,229,851 B2
(45) Date of Patent: Jun. 12, 2007

(54) SEMICONDUCTOR CHIP STACK

(75) Inventor: Holger Hubner, Baldham (DE)

(73) Assignee: Infineon Technologies AG (DE)

( * ) Notice: Subject to any disclaimer, the term of this patent is extended or adjusted under 35 U.S.C. 154(b) by 102 days.

(21) Appl. No.: 11/180,039

(22) Filed: Jul. 11, 2005

(65) Prior Publication Data

US 2006/0001177 A1    Jan. 5, 2006

Related U.S. Application Data

(63) Continuation of application No. PCT/DE03/03961, filed on Dec. 2, 2003.

(30) Foreign Application Priority Data

Jan. 10, 2003 (DE) ................. 103 00 711

(51) Int. Cl.
*H01L 21/44* (2006.01)
*H01L 21/48* (2006.01)
*H01L 21/50* (2006.01)

(52) U.S. Cl. ............... 438/109; 438/112; 438/118; 257/777

(58) Field of Classification Search ........ 438/109, 438/112, 118
See application file for complete search history.

(56) References Cited

U.S. PATENT DOCUMENTS

| 5,311,059 A | 5/1994 | Banerji et al. |
| 5,930,599 A | 7/1999 | Fujimoto et al. |
| 2002/0115233 A1 | 8/2002 | Nakaoka et al. |
| 2003/0162324 A1* | 8/2003 | Tomimatsu ................. 438/109 |

FOREIGN PATENT DOCUMENTS

| DE | 101 24 774 A1 | 12/2002 |
| EP | 0 348 972 A2 | 1/1990 |
| WO | WO-01/18851 A1 | 3/2001 |
| WO | WO-01/27989 A1 | 4/2001 |
| WO | WO-02/095817 A2 | 11/2002 |

* cited by examiner

*Primary Examiner*—Phat X. Cao
(74) *Attorney, Agent, or Firm*—Dickstein, Shapiro, LLP.

(57) ABSTRACT

A the semiconductor chip stack in which an intermediate space between semiconductor chips is filled at least along one edge of the upper face of a top chip by a spacer composed of a polymer which can be structured photographically, of photoresist, of an encapsulation compound or an adhesive, and is sealed from the outside. During the passivating process, the connecting contact pads are kept free of the material of this spacer for bonding wires or other external connections on the upper face of the bottom chip.

5 Claims, 1 Drawing Sheet

SEMICONDUCTOR CHIP STACK

CROSS-REFERENCE TO RELATED APPLICATION

This application is a continuation of International Patent Application Ser. No. PCT/DE2003/003961, filed Dec. 2, 2003, which published in German on Jul. 29, 2004 as WO 2004/064139, and is incorporated herein by reference in its entirety.

FIELD OF THE INVENTION

The present invention relates to a semiconductor chip stack, and to a method for passivating a semiconductor chip stack.

BACKGROUND OF THE INVENTION

Semiconductor chip stacks can be produced in that two semiconductor chips which each have an upper face that is provided with at least one electronic component and one wiring level are permanently connected to one another with these upper faces facing one another, with connecting contacts on the respective semiconductor chips being directly electrically connected to one another via an interposer or a vertical electrically conductive connection. This arrangement (face-to-face) has the disadvantage that it is difficult to passivate the intermediate space or gap which remains between the semiconductor chips. Such passivation should not impede the rest of the assembly process; in particular, connecting contact pads on a bottom chip should not be contaminated for external connection, for example by means of bonding wires.

The chips are normally passivated using oxinitride and polyimide. However, this requires a subsequent photolithographic opening for the connecting contact pads (bonding pads). Lithography can be carried out only with difficulty on the populated wafers because the wafers which contain the bottom chips that have not yet been separated are difficult to cover with resist layers and to expose once the top chips have been fitted. The passivation process is in particular made more difficult when interconnects on the upper face of the bottom chip lead from the free upper face under the top chips that have been fitted. The connecting contact pads may also be positioned very closely adjacent to the top chips (a few hundred micrometers), so that conventional package encapsulation compounds cannot be used to seal the intermediate space.

SUMMARY OF THE INVENTION

A semiconductor chip stack has first and second semiconductor chips having upper faces facing one another, where the upper faces respectively have at least one electronic component and at least one connecting contact permanently electrically conductively connected to the connecting contact of the other of the first and second semiconductor chips, and a spacer that fills and closes from the outside an intermediate space between the first and second semiconductor chips, at least on a strip along one edge of the upper face of the second semiconductor chip. At least one connecting contact pad on the upper face of the first semiconductor chip is free of this spacer.

DETAILED DESCRIPTION OF PREFERRED EMBODIMENTS OF THE INVENTION

Figure 1:
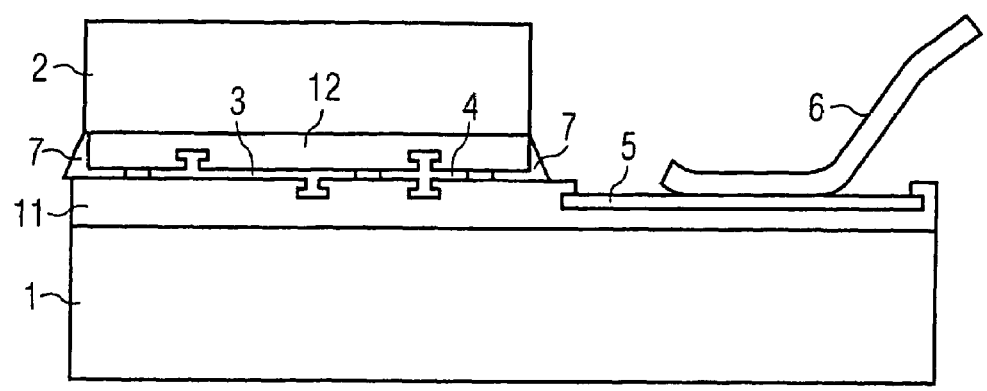
FIG. 1 shows a cross section through an arrangement of a semiconductor chip stack.

An object of the present invention is to specify one possible way to passivate the intermediate space between face-to-face mounted semiconductor chips.

In the semiconductor chip stack, an intermediate space between the semiconductor chips is filled at least along one edge of the upper face of the smaller, upper semiconductor chip (top chip) by a spacer composed of a polymer which can be photographically structured, of a photoresist, of an encapsulation compound or of an adhesive, and is thus closed from the outside. During this process, the connecting contact pads for bonding wires or other external connections on the upper face of the other semiconductor chip (bottom chip) are kept free of the material of this spacer. Instead of just one spacer in the intermediate space, it is also possible to provide a larger spacer, which is fitted to the flanks of the upper semiconductor chip, for better sealing of the intermediate space.

The material is preferably a photoresist which penetrates into the intermediate space after assembly of the chip stack, and preferably completely fills the intermediate space. The photoresist can then be exposed, with the element in the intermediate space being shadowed by the upper semiconductor chip. The exposed element is treated with a developer liquid, in the manner which is known per se from lithography technology, and is removed. Any desired polymer which can be structured photographically is in principle suitable for this purpose, in particular polyimide or BCB.

However, it is also possible to use an encapsulation compound, in particular an epoxy resin, or an adhesive which is removed by a solvent on the free upper face of the lower semiconductor chip. A material which can be structured photographically in contrast has the advantage that the layer of this material can be applied such that it is somewhat thicker than the intermediate space, so that, as a consequence of the side shadowing at the edges of the upper semiconductor chip, a larger element subsequently remains, on development and removal of this material, at the side on the edges of the upper semiconductor chip than on the free surface of the lower semiconductor chip. This thus results in larger spacers being formed in a simple manner on the edges on the flanks of the top chip, reliably sealing the intermediate space between the semiconductor chips.

FIG. 1 shows an arrangement comprising a larger lower semiconductor chip (bottom chip 1) and a smaller upper semiconductor chip (top chip 2) in the form of a cross section. The upper faces of the chips, which are provided with components, face one another (i.e., are face-to-face) and are permanently attached to one another. These upper faces normally each have wiring levels 11, 12 composed of one or more metallization levels which are structured on the basis of the wiring to form interconnects, and are separated from one another by intermediate metal dielectrics.

In order to produce the chip stack, the top chips are fitted upside down onto a wafer, which still contains the bottom chips in the composite wafer, and are attached to the respective bottom chips. The respective mutually associated connecting contacts on the chips are permanently electrically conductively connected to one another by means of interposers 3 or vertical electrically conductive connections 4 between connecting contacts which are arranged directly one above the other, which can be done using one of the soldering methods which are known per se.

There is a fine intermediate space or gap between the chips in this arrangement which, according to the invention, is passivated using a spacer 7 composed of a polymer which can be structured photographically, a photoresist, an encapsulation compound or an adhesive. The spacer can be used to fill the entire intermediate space or, as is illustrated in FIG. 1, only the narrow area along the edge of the top chip 2. The spacers are preferably designed such that, as can be seen in the cross section in FIG. 1, the side edges of the smaller upper semiconductor chip (top chip 2) are also passivated with the material. This results in a particularly reliable seal for the intermediate space between the semiconductor chips from the outside. One advantage of this arrangement is, in particular, that the connecting contact pads 5 on the bottom chip 1 at the side of the top chip 2 are kept completely free of the material of the spacers 7, so that electrical connections, for example a bonding wire 6 that is shown in FIG. 1, can be fitted there.

In order to produce this arrangement, the wafers fitted with the top chips are, in a first exemplary embodiment, coated with a polymer which can be structured photographically (for example polyimide, BCB). A material with a sufficiently low viscosity is chosen, which penetrates into the gap between the chips and preferably completely fills the gap, or else fills it at least at the edges. This process can be assisted by coating the wafer with the material in a vacuum. The wafer is then illuminated with a floodlight, with the top chips shadowing the elements of the applied material which have penetrated in. The polymer which can be structured photographically is then developed in order to remove the exposed elements. In consequence, all of the surfaces alongside the top chips are exposed again, in particular including the connecting contact pads (bonding pads) for external electrical connection. The gap between the chips is sealed and prevents corrosion of the conductor surfaces between the chips. The exposed surfaces can then, for example, be gold-plated non-electrically.

The width of the spacer can be controlled by the nature of the exposure. Exposure using collimated light makes use of the fact that the exposure dose that is required for complete exposure of the layer composed of polymer which can be structured photographically or of photoresist increases with the layer thickness. At the edges of the top chip, where the layer thickness is higher than on the open surfaces of the bottom chip, a greater unexposed residual component ("resist foot") thus remains when the exposure dose is low, resulting in the desired particularly good sealing of the intermediate space between the chips. If diffuse exposure is used, as can be achieved by way of example, by the installation of a ground glass disk in the automatic exposure machine instead of a lithography mask, the side element of the spacer 7 becomes thicker or higher, since the top chip produces an additional shadowing effect directly alongside the edge of the top chip. While the diffuse radiation strikes the other surfaces from a half spatial angle ($2\pi/3$), only the radiation from a quarter of a spatial angle ($\pi/3$) strikes the edge of the top chip.

A spacer can also be used to prevent underetching of the chip stack during wet-chemical etching processes. In this case, it is advantageous to produce the spacer from photoresist, since the photoresist can easily be removed again after the etching process.

In principle, any desired encapsulation compounds or adhesives, even without any photosensitive components, may be used as the material for the spacers. The material that is used need have only a sufficiently low viscosity in order to allow it to penetrate into the gap between the semiconductor chips. Those surfaces of the bottom chip which are not covered by the top chip have the encapsulation compound or the adhesive removed by means of a solvent. Slight penetration of the solvent between the chips in the semiconductor stack can be tolerated even if this results in the passivation layer being removed again in an outer edge area of the intermediate space.

What is claimed is:

1. A method for passivating a semiconductor chip stack having at least first and second semiconductor chips, which each have an upper face provided with at least one electronic component and at least one connecting contact, and are permanently connected to one another in an arrangement in which the upper faces of the first and second semiconductor chips face one another, with at least two mutually associated connecting contacts on the first and second semiconductor chips being electrically conductively connected to one another, the method comprising the steps of:

applying a material of sufficiently low viscosity to the upper face of the first semiconductor chip, such that an intermediate space between the first and second semiconductor chips is filled with the material at least along one edge of the upper face of the second semiconductor chip; and largely removing the material from the upper face of the first semiconductor chip, such that a connecting contact pad on this upper face is exposed, and the intermediate space between the first and second semiconductor chips remains sealed on the outside.

2. The method as claimed in claim 1, wherein the applying step comprises the step of structuring a polymer photographically or applying a photoresist to the upper face of the first semiconductor chip, the method further comprising the step of exposing the material to light, with a proportion of the material in the intermediate space remaining unexposed, and wherein in the removing step, the exposed material is removed.

3. The method as claimed in claim 2, wherein in the applying step, the material is applied such that it is thicker than the intermediate space, wherein in the exposing step, the material is diffusely exposed such that the material at the side of the second semiconductor chip is exposed less than the remainder of the material, and wherein in the removing step the exposed material is removed such that spacers composed of the material remain on side edges of the second semiconductor chip and seal the intermediate space from the outside.

4. The method as claimed in claim 1, wherein the material of the spacer is an encapsulation compound which contains an epoxy resin, and in the removing step, the encapsulation compound is removed outside the intermediate space using a solvent.

5. The method as claimed in claim 1, wherein the material of the spacer is an adhesive, and in the removing step, the adhesive is removed outside the intermediate space using a solvent.

* * * * *

UNITED STATES PATENT AND TRADEMARK OFFICE
CERTIFICATE OF CORRECTION

PATENT NO. : 7,229,851 B2
APPLICATION NO. : 11/180039
DATED : June 12, 2007
INVENTOR(S) : Holger Hubner It is certified that error appears in the above-identified patent and that said Letters Patent is hereby corrected as shown below:

Title page Item [57]
In the Abstract:

On the Title of the patent, in line 1 of the Abstract, "A the semiconductor" should read --A semiconductor--

Signed and Sealed this

Seventh Day of August, 2007

JON W. DUDAS
*Director of the United States Patent and Trademark Office*